(12) United States Patent
Jiang

(10) Patent No.: US 6,900,745 B2
(45) Date of Patent: May 31, 2005

(54) METHOD OF SCALABLE GRAY CODING

(75) Inventor: Hongtao Jiang, Anaheim, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/842,605

(22) Filed: May 10, 2004

(65) Prior Publication Data

US 2004/0207547 A1 Oct. 21, 2004

Related U.S. Application Data

(63) Continuation of application No. 10/320,282, filed on Dec. 16, 2002, now Pat. No. 6,762,701.

(51) Int. Cl.[7] .............................................. H03M 7/16
(52) U.S. Cl. ............................ 341/98; 377/34; 377/108; 711/217; 711/218
(58) Field of Search .............................. 341/96, 97, 98; 377/26, 33, 34, 108; 711/217, 218, 219

(56) References Cited

U.S. PATENT DOCUMENTS

| | | | | | |
|---|---|---|---|---|---|
| 5,687,354 A | * | 11/1997 | Koo | ............................. | 711/163 |
| 6,134,629 A | * | 10/2000 | L'Ecuyer | ..................... | 711/110 |
| 6,269,138 B1 | * | 7/2001 | Hansson | ....................... | 377/26 |
| 6,337,893 B1 | * | 1/2002 | Pontius | ....................... | 377/108 |
| 6,703,950 B2 | * | 3/2004 | Yi | ................................ | 341/97 |
| 6,801,143 B2 | * | 10/2004 | Oberai et al. | .................. | 341/98 |

* cited by examiner

*Primary Examiner*—Howard L. Williams
(74) *Attorney, Agent, or Firm*—Timothy W. Markison; Garlick, Harrison & Markison

(57) ABSTRACT

A method for generating a modulo Gray-code representation of a non-power-of-two set of binary values begins by determining a desired Gray-code sequence length. The method then continues by determining a bus width, M, in bits, based on the desired Gray-code sequence length, to represent the generated Gray-code. The method then continues by determining a set of skipped binary values based on the desired Gray-code sequence length and the bus width to obtain the non-power-of-two set of binary values. The method then continues by representing the non-power-of-two set of binary values as a set of equivalent Gray-code values.

6 Claims, 8 Drawing Sheets

Gray-Code Counter 200 optical interface 100

Gray-Code Incrementer-Decrementer 150

Gray-Code Counter 200 apparatus 400

METHOD OF SCALABLE GRAY CODING

This patent application is claiming priority under 35 USC § 120 to and is a continuation patent application Ser. No. 10/320,282 entitled A SCALABLE GRAY CODE COUNTER AND APPLICATIONS THEREOF, having a filing date of Dec. 16, 2002, an issuance date of Jul. 13, 2004, and a patent number of U.S. Pat. No. 6,762,701.

TECHNICAL FIELD OF THE INVENTION

This invention relates generally to computing devices, and, more particularly to data communication systems comprising such devices. Even more particularly, the present invention relates to integrated circuit design using Gray Code within such communication systems.

BACKGROUND OF THE INVENTION

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals to produce baseband signals, and demodulates the baseband signals in accordance with a particular wireless communication standard to recapture the transmitted data. The receiver is coupled to an antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with one or more local oscillations to convert the amplified RF signals into the baseband signals or intermediate frequency (IF) signals. The filtering stage filters the baseband signals or the IF signals to attenuate unwanted out-of-band signals to produce filtered signals. The data recovery stage recovers raw data from the filtered signals in accordance with the particular wireless communication standard.

As is also known, the transmitter converts data into RF signals by modulating the data to produce baseband signals and mixing the baseband signals with an RF carrier to produce RF signals. The transmitter includes a data modulation stage, one or more intermediate frequency stages, and a power amplifier. The data modulation stage converts the raw data into baseband signals in accordance with a particular wireless communication standard. The one or more intermediate frequency stages mix the baseband signals with one or more local oscillations to produce the RF signals. The power amplifier amplifies the RF signals prior to transmission via the antenna.

Further, data transmissions are serial streams of data, but within a network component (e.g., switch, relay, bridge, gateway, et cetera) the data is processed in parallel. It is a function of the transceiver within each communication device or network component to convert data from a serial to a parallel form, or vice-versa. In general, the transmitter converts parallel data into serial data and sources the serial data onto a communications link. A receiver receives serial data via a communications link and converts it into parallel data. A critical function of the receiver is to accurately sample the received serial data to be able to produce the parallel data.

As communication systems have become more advanced, and as their data capacity has increased, buffering of incoming and outgoing data has become essential. Buffering of data allows a host device to attend to other tasks on a time-multiplexed basis during a communications session. For example, buffering is used to hold multiple communication sessions simultaneously, to perform signal modulation and demodulation and to perform error correction. In addition, buffering can facilitate asynchronous communications, making it unnecessary for communication devices to share a common time base.

Buffering is commonly accomplished using RAM-based FIFOs. A FIFO is a first-in-first-out (FIFO) device in which data is temporarily stored in random-access memory (RAM). When a suitable unit, e.g., a byte, of data is received by the FIFO, the data unit is stored at a FIFO address indicated by a write pointer. Once that data is stored, the write pointer is incremented to the next FIFO address, which is where the next unit of received data will be stored. When a device is ready to read from the FIFO, it reads from a FIFO address indicated by a read pointer. After the data is read, the read pointer is incremented so that the next read is from the next FIFO address. Each pointer is basically a counter that counts data transfers. The counters are modulo in that they wrap to zero when a maximum count is reached.

Counters are used extensively in the design of integrated circuits. For example, conventional binary-code counters can be used as FIFO pointers. Binary counter design is mature enough that, by entering a few specifications (such as the counter range and speed), a computer can provide an optimized counter design. With a binary counter, however, there can be many bit differences in the representation of two adjacent binary numbers. A disadvantage of binary counters, therefore, is that there can be considerable ambiguity when a count is read during a count transition. For example, when a count increments from 011=3 to 100=4, every bit value changes. However, the changes can take place at slightly different times across the bit positions. If the count is used in the same clock domain, this is not a big problem. However, when the count is used in more than one clock domain (e.g., in an asynchronous circuit design), ambiguity can result as to the correct count.

For example, in a RAM-based asynchronous FIFO, the status of the FIFO (i.e., whether a data unit is present in the FIFO) is determined by comparing the read pointer and the write pointer. However, because the read pointer and the write pointer are in different clock domains, direct comparison will not generate a reliable result. For example, when the count increments from 011=3 to 100=4, any of eight possible 3-bit binary values might be read during the transition. This simultaneous transition of a large number of bits can increase the risk of transition errors and can increase the electrical noise generated by the circuitry. Attempts to design around such extreme ambiguities can add considerable complexity to the counter or to circuit elements that respond to the counter.

To avoid the problems with binary counters, "Gray Code" counters are often used. Gray code is an alternative to binary code that requires a change in only one bit position between adjacent numbers. An example 3-bit Gray-code sequence can be: 0=000, 1=001, 2=011, 3=010, 4=110, 5=111, 6=101, and 7=100. Incrementing the last value, 100, yields the first value 000. Since only one bit position changes during a unit increment, the only possible reads during a transition are the value being changed from and the value being changed to. It is much easier to design around this limited ambiguity than it is to design around the much more extensive ambiguities associated with binary counter reads. Further, in an asynchronous circuit, a Gray-code counter's count can be transferred among the different clock domains without the noise and transition errors of a binary counter.

While Gray-codes are well known in the art and can be readily constructed for any bit length, Gray-code counters are more complex and difficult to design. Further, Gray-code counters are not readily scaled. Some prior art solutions addressing these problems exist. For example, a typical prior art Gray-code counter comprises a count register for storing a Gray-code value, a Gray-to-binary code translator for converting the stored Gray-code value to a corresponding binary-code value, a binary-code incrementer for incrementing the binary-code value, and a binary-Gray-code translator for converting the incremented binary-code value to the corresponding Gray-code value. However, another limitation of Gray-code is that it requires an integer depth that is a power of two. Thus, a disadvantage of prior art Gray-code counters is that, when the target FIFO depth is not a power of two, the FIFO design has excess capacity. For example, when a communications application only requires a FIFO depth of 78, the power-of-two limitation requires the use of a 128-address FIFO.

In contrast, binary-code counters can be designed for any positive integer depth. The discrepancy between target and Gray-code-imposed capacities can be much greater for larger FIFOs, resulting in the inability to use a prior art Gray-code counter because of size and/or costs constraints in terms of integrated circuit area and because an oversized FIFO may be too slow for the particular application.

Some prior art solutions to these problems do exist. These solutions comprise skipping certain binary values while maintaining the Gray-code nature of the count. However, a very complex algorithm is used in these prior art solutions to determine which binary values to skip. These solutions thus require a computer and associated software to run the algorithm and determine the Gray-code pattern for a given modulo number. For especially large modulo numbers (FIFO size), the Gray-code pattern will have to be stored on the integrated circuit for rapid access. Further, when determining the FIFO status, the counter data must be transformed from a Gray-code pattern, to a binary pattern, and back to a Gray-code pattern. Having to perform the complex algorithm twice involves a heavy cost in time and efficiency.

Therefore, a need exists for a Gray-code counter and a binary incrementer-decrementer algorithm therefore that can reduce or eliminate the complexity and efficiency problems associated with the prior art.

BRIEF SUMMARY OF THE INVENTION

The method of scalable gray scale coding of the present invention substantially meet these needs and others. In one embodiment, a method for generating a modulo Gray-code representation of a non-power-of-two set of binary values begins by determining a desired Gray-code sequence length. The method then continues by determining a bus width, M, in bits, based on the desired Gray-code sequence length, to represent the generated Gray-code. The method then continues by determining a set of skipped binary values based on the desired Gray-code sequence length and the bus width to obtain the non-power-of-two set of binary values. The method then continues by representing the non-power-of-two set of binary values as a set of equivalent Gray-code values.

DETAILED DESCRIPTION OF THE INVENTION

Figure 1:
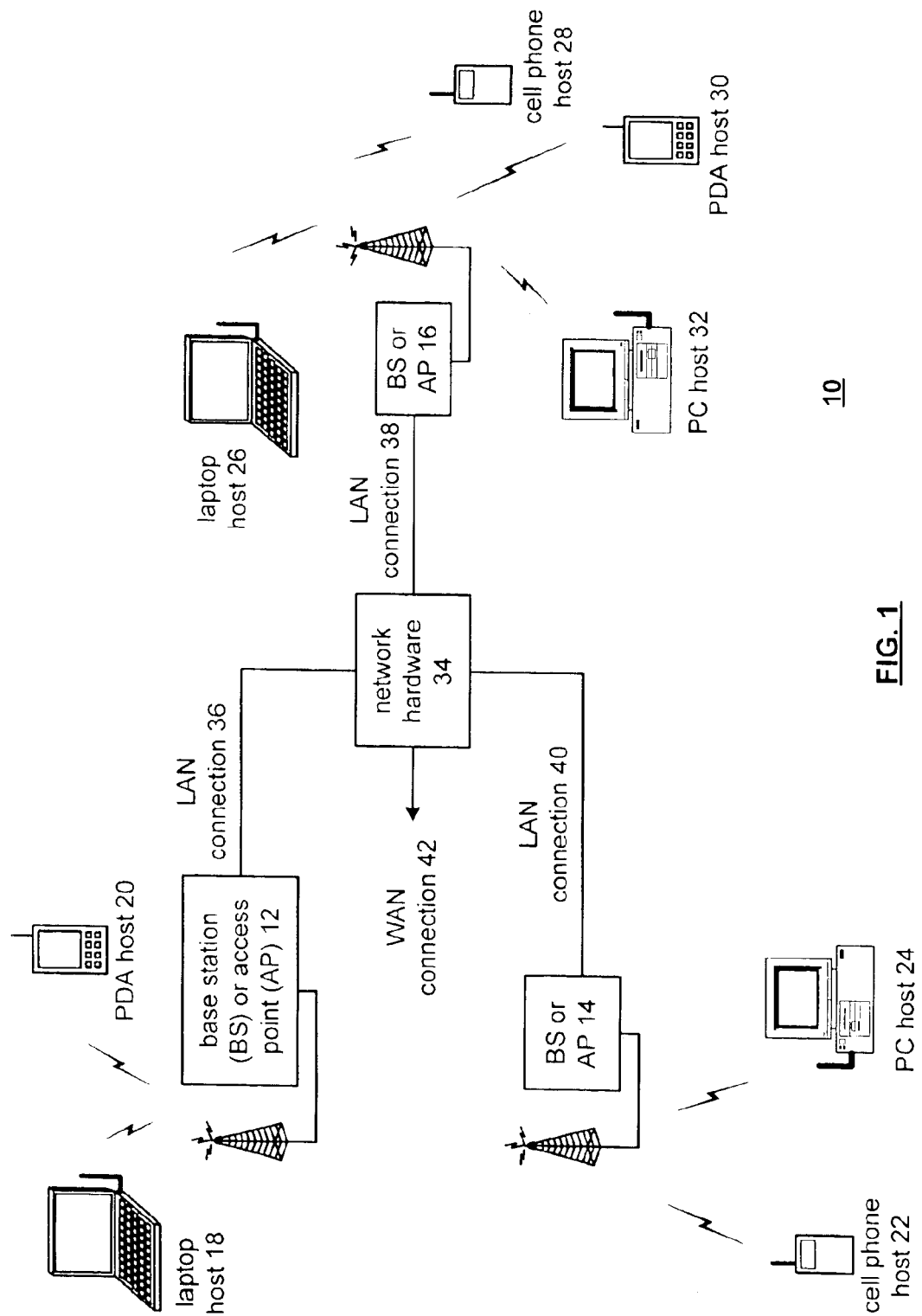
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2. The non-power-of-two modulo N Gray-code counter (the "Gray-code counter") and binary incrementer-decrementer algorithm of the present invention can be incorporated within any of base stations and/or access points 12–16, wireless communication devices 18–32 and network hardware component 34. For example, embodiments of the present invention can be implemented as a pointer for a first-in-first-out (FIFO) within a communications buffering scheme.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel. Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
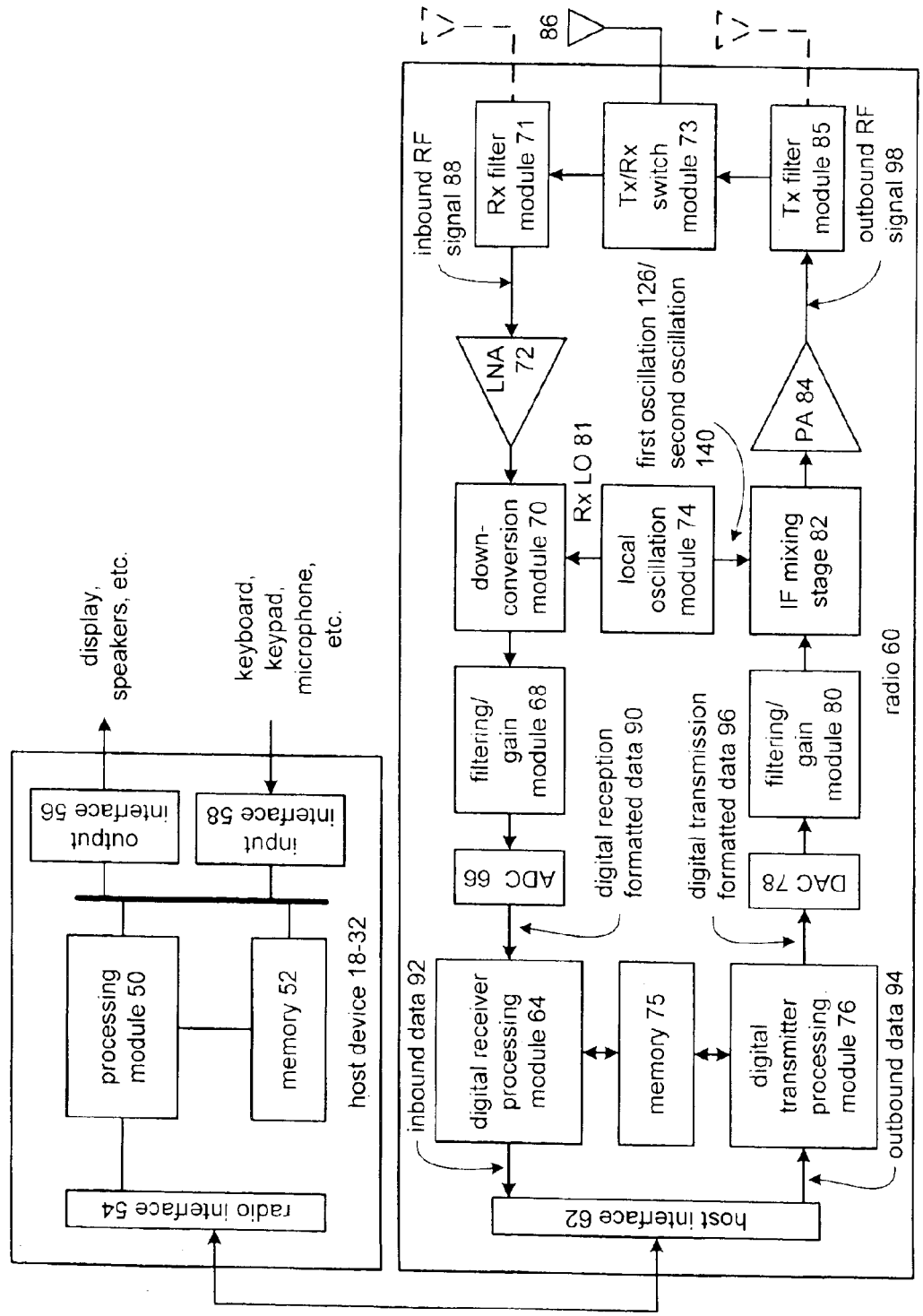
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the transmit/receive switch 73, or may include separate antennas for the transmit path and the receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on an output oscillation provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54. Embodiments of the Gray-code counter and binary incrementer-decrementer algorithm of this invention can be implemented within any of base stations and/or access points 12–16, wireless communication devices 18–32, network hardware component 34, and/or radio 60 at any communications interface requiring buffering of received and/or transmitted data, modulation or demodulation, crossing of a clock boundary (for asynchronous communications), or memory storage.

Figure 3:
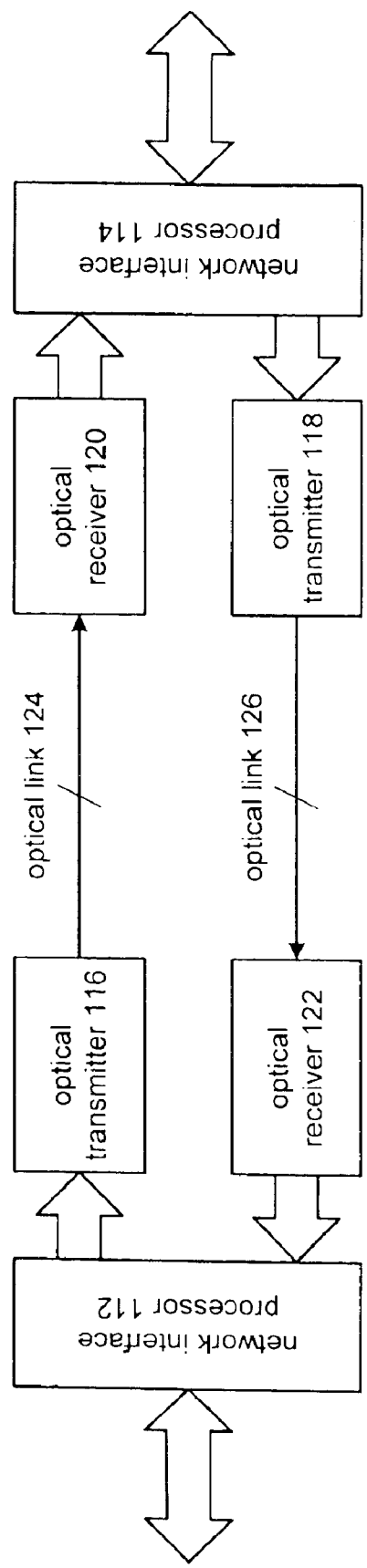
FIG. 3 is a schematic block diagram of an optical interface in accordance with the present invention.

FIG. 3 is a schematic block diagram of an optical interface 100 within, for example, network hardware component 34, that includes network interface processors 112 and 114, optical transmitters 116 and 118, optical receivers 120 and 122 and optical links 124 and 126. Each optical link 124 and 126 may support one or more serial data streams at a rate specified by SONET or other fiber optic communication standard. Embodiments of the Gray-code counter and binary incrementer-decrementer algorithm of this invention can be implemented within any of network interface processors 112 and 114, optical transmitters 116 and 118, and/or optical receivers 120 and 122 to replace traditional Gray-code counters that may otherwise be used in buffering, memory storage or other counter applications.

In general, data is transceived via the network interface processors 112 and 114, which may be included in a network component such as a switch, a bridge, a relay, a router, and/or any other type of network component used in fiber optic networks, the Internet, public switch telephone network, and/or any other wide area network or local area network. As shown, the data provided by network interface processor 112 to optical transmitter 116 is in a parallel format. The optical transmitter 116 converts the parallel data into serial data that is transmitted via optical link 124. Optical receiver 120 receives the serial data and converts it back into parallel data, which is provided to network interface processor 114.

Similarly, network interface processor 114 provides parallel data to optical transmitter 118. Optical transmitter 118 converts the parallel data into serial data and communicates it via optical link 126 to optical receiver 122. Optical receiver 122 converts the serial data into parallel data and provides the parallel data to network interface processor 112.

As one of average skill in the art will appreciate, the optical interface 100 corresponds generally to any interface within any type of digital communication system that employs serial data transmission between devices. Accordingly, the optical links 124 and 126 may be replaced by radio frequency links, microwave links, wires, et cetera. Accordingly, the concepts of the present invention are equally applicable in optical communication systems as well as any other type of digital communication system.

Figure 4:
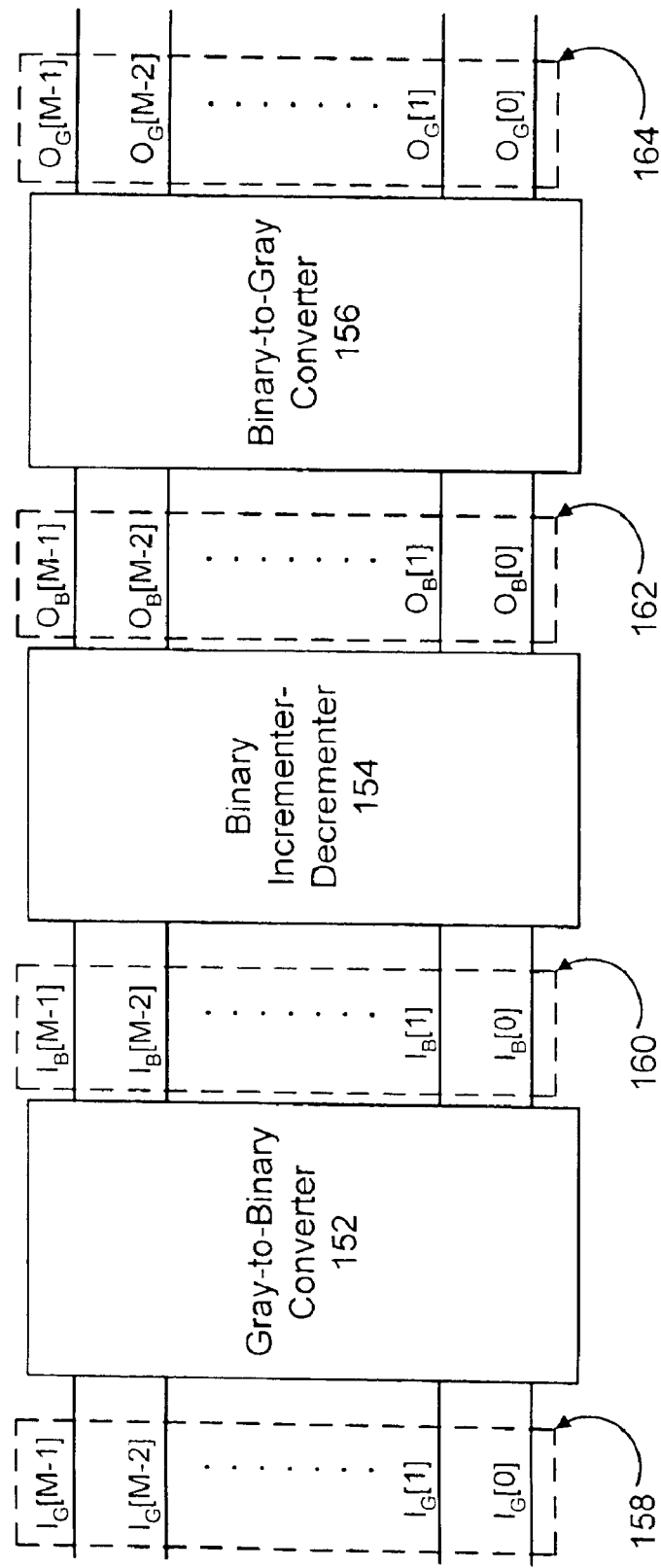
FIG. 4 is a schematic block diagram of a Gray-code incrementer-decrementer in accordance with the present invention.

FIG. 4 is a schematic block diagram of a Gray-code incrementer-decrementer 150 in accordance with the teachings of this invention. Gray-code incrementer-decrementer 150 comprises Gray-to-binary converter 152, binary incrementer-decrementer 154 and binary-to-Gray converter 156. Gray-to-binary converter 152 receives as an input an M-bit Gray-code value 158, expressed as bit values $I_G[0]$-$I_G[M-1]$, in order of increasing significance. M-bit Gray-code value 158 can be, for example, the prior count input to a Gray-code counter incorporating the Gray-code incrementer-decrementer 150, as is discussed in greater detail with reference to FIG. 5. Gray-to-binary converter 152 converts the M-bit Gray-code value 158 to a binary equivalent M-bit binary input value 160, expressed as bit values $I_B[0]$-$I_B[M-1]$. The most-significant binary bit of M-bit binary input value 160 is the same as the most-significant Gray-code bit of M-bit Gray-code value 158, and so on. Gray-to-binary converter 152 can be any Gray-to-binary converter as known to those in the art.

Binary incrementer-decrementer (BIN) 154 receives the M-bit binary input value 0.160 and converts it to an incremented or decremented M-bit binary output value 162, expressed as bit values $O_B[0]$-$O_B[M-1]$. In most cases, M-bit binary output value 162 is one unit greater or one unit less than M-Bit binary input value 160, as with conventional prior-art incrementers-decrementers. However, to provide for non-power-of-two modulo N Gray-code counters, BIN 154 of this invention includes a binary incrementer-decrementer algorithm (BIN algorithm) for skipping certain binary values while maintaining the Gray-code nature of the output of Gray-code incrementer-decrementer 150.

BIN 154 skips certain binary values, which are determined based on the integer depth (range), N, of the Gray-code incrementer-decrementer 150, and the bus width in bits, M, used to represent the Gray-code and binary values. The integer depth N is an even whole number and can also represent the range of, for example, a counter incorporating Gray-code incrementer-decrementer 150, or the address range of a RAM-based FIFO buffer. Once the value of N is determined, for example, by the desired range of a Gray-code counter for a given application, the bus width, M, is obtained by determining a value of $2^M$ that is greater than or equal to N, where M is a positive whole value. The preferred value of M is typically obtained by using the smallest value of $2^M$ that is greater than or equal to N. For example, for a modulo 6 Gray-code counter (i e., a Gray-code counter having a range of N=6), the value of M can be 3 (i.e., $2^3$ is the smallest power of two greater than or equal to six).

For a given value of N and M, the embodiments of the BIN algorithm of this invention can then determine the binary values for BIN 154 to skip according to one of the algorithms disclosed below. It should be noted that in any embodiment of the BIN algorithm of this invention, the number of binary values skipped is equal to S, where $S=2^M-N$. This should be easy to see, since if the range of BIN 154 is N, a standard power-of-two Gray-code input to Gray-to-binary converter 152 will have a range of $2^M$ Gray-code values. To obtain the non-power-of-two modulo N Gray-code incrementer-decrementer 150 functionality in accordance with the teachings of this invention, the range of values in excess of N must be eliminated. Thus, if BIN 154 is implemented as an incrementer, then in one embodiment BIN 154 increments M-bit binary input value 160 according to the BIN logic algorithm:

IF $I_B[m\text{-}1{:}0]=2^{M-1}+N/2-1$, THEN
$O_B[m\text{-}1{:}0]=2^{M-1}-N/2$
ELSE
$O_B[m\text{-}1{:}0]=I_B[m\text{-}1{:}0]+1$.

In a similar manner, BIN 154 decrements M-bit binary input value 160 according to the corresponding decrementing BIN logic algorithm:

IF $I_B[m\text{-}1{:}0]=2^{M-1}-N/2$, THEN
$O_B[m\text{-}1{:}0]=2^{M-1}+N/2-1$
ELSE
$O_B[m\text{-}1{:}0]=I_B[m\text{-}1{:}0]-1$.

The incrementer-decrementer logic algorithms disclosed above have the effect of skipping the first S/2 binary values and the last S/2 binary values of a sequential set of $2^M$ M-bit binary input values 160. The remaining set of binary values comprises a non-power-of-two set of binary values, which when converted from binary-code to Gray-code by binary-to-Gray converter 156, will preserve the Gray-code nature of the BIN 154. For example, a BIN 154 with a range of modulo 12 (N=12) has a bus width M=4 (i.e., with $2^M=16$, M=4). S is then equal to 16−12=4. Thus, a total of 4 binary values will be skipped, one half (2) at the beginning of the sequential set of $2^M$ M-bit binary input values 160, and the remaining half at the end of the sequential set of $2^M$ M-bit binary input values 160.

In another embodiment of the BIN algorithm of this invention, if BIN 154 is implemented as an incrementer, then BIN 154 increments M-bit binary input value 160 according to the BIN logic algorithm:

IF $I_B[m\text{-}1{:}0]=N/2-1$, THEN
$O_B[m\text{-}1{:}0]=2^M-N/2$
ELSE
$O_B[m\text{-}1{:}0]=I_B[m\text{-}1{:}0]+1$.

In a similar manner, BIN 154 decrements M-bit binary input value 160 according to the corresponding decrementing BIN logic algorithm:

IF $I_B[m\text{-}1{:}0]=2^M-N/2$, THEN
$O_B[m\text{-}1{:}0]=N/2-1$
ELSE
$O_B[m\text{-}1{:}0]=I_B[m\text{-}1{:}0]-1$.

The incrementer-decrementer logic algorithms of the second embodiment disclosed above have the effect of skipping the middle S binary values of a sequential set of $2^M$ M-bit binary input values 160. The remaining set of binary values again comprises a non-power-of-two set of binary values, which when converted from binary-code to Gray-code by binary-to-Gray converter 156, will preserve the Gray-code nature of the BIN 154. For the same modulo 12 example discussed above with reference to the first embodiment of the BIN algorithm, the second embodiment of the BIN algorithm will result in skipping of the middle 4 binary values of the sequential set of $2^M$ M-bit binary input values 160.

The embodiments of the BIN 154 of this invention, and of a Gray-code counter incorporating BIN 154, thus provide a Gray-code counter for any even modulo number. For a power-of-two modulo number, the Gray-code counter of this invention reduces to a conventional Gray-code counter. For a non-power-of-two modulo number, however, the embodiments of this invention will skip binary values as disclosed above to generate a Gray-code representation of a non-power-of-two set of binary values. The modulo 12 example discussed above is summarized in the following Table 1 for both disclosed embodiments. In this example, the sequential set of $2^M$ M-bit binary input values 160 comprises the binary values 0–15.

TABLE 1

| DECIMAL VALUE | BINARY VALUE | GRAY-CODE VALUE |
| --- | --- | --- |
| [0] | [0000] | [0000] |
| [1] | [0001] | [0001] |
| 2 | 0010 | 0011 |
| 3 | 0011 | 0010 |
| 4 | 0100 | 0110 |
| 5 | 0101 | 0111 |
| {6} | {0110} | {0101} |
| {7} | {0111} | {0100} |
| {8} | {1000} | {1100} |
| {9} | {1001} | {1101} |
| 10 | 1010 | 1111 |
| 11 | 1011 | 1110 |
| 12 | 1100 | 1010 |
| 13 | 1101 | 1011 |
| [14] | [1110] | [1001] |
| [15] | [1111] | [1000] |

[ ] Skipped by first embodiment; { } Skipped by second embodiment.

As indicated by inspection of Table 1, if no values are skipped, Table 1 corresponds to a 4-bit Gray-code incrementer-decrementer (or associated Gray-code counter) with sixteen distinct values. The middle column corresponds to the BIN 154. To achieve a Gray-code incrementer-decrementer 150 with twelve distinct values, the present invention provides for skipping 4 values, e.g., decimal values 0, 1, 14, and 15 for a first embodiment, or decimal values 6–9 for a second embodiment of the BIN algorithm, as indicated by the respective parentheses in Table 1. Thus, in the first embodiment, when the decimal count is 13, the Gray-code count is 1011, which is translated as binary-code 1101. When this is incremented by BIN 154, the result is 2=0010 binary-code. This will be converted to 2=0011 Gray-code. 2=0011 Gray-code differs from 13=1011 at only the first position. The Gray-code nature of the count sequence is thus preserved.

Conventional Gray-code (as shown in the last column of Table 1) is well known. Gray-codes cab be readily constructed for any bit length. A one-bit Gray-code can be the same as a one-bit binary-code. The sequence is 0,1. A two-bit Gray-code can be generated form a one-bit Gray-code using the following algorithm. First, the sequence is copied to yield 0,1;01. Then, the second copy is reversed to yield 0,1;1,0. Lastly, leading zeroes are added to the values in the first copy and leading ones are added to the values in the second copy to yield 00,01,11,10. This is a two-bit Gray-code. The same algorithm can be applied to the two-bit Gray-code to yield a three-bit Gray-code, and can be further iterated to yield Gray-codes of any bit length. Such a conventional Gray-code is the basis for conversion by BIN 154 into a non-power-of-two Gray-code in accordance with the teachings of this invention.

Binary-to-Gray converter 156 of FIG. 4 converts the M-bit binary output value 162 to a Gray-code equivalent M-bit Gray-code output value 164, expressed as bit values $O_G[0]$-$O_G[M\text{-}1]$. The most-significant Gray-code bit of M-bit Gray-code output value 164 is the same as the most-significant binary bit of M-bit binary output value 162, and so on. Binary-to-Gray converter 156 can be any binary-to-Gray converter as known to those in the art.

Figure 5:
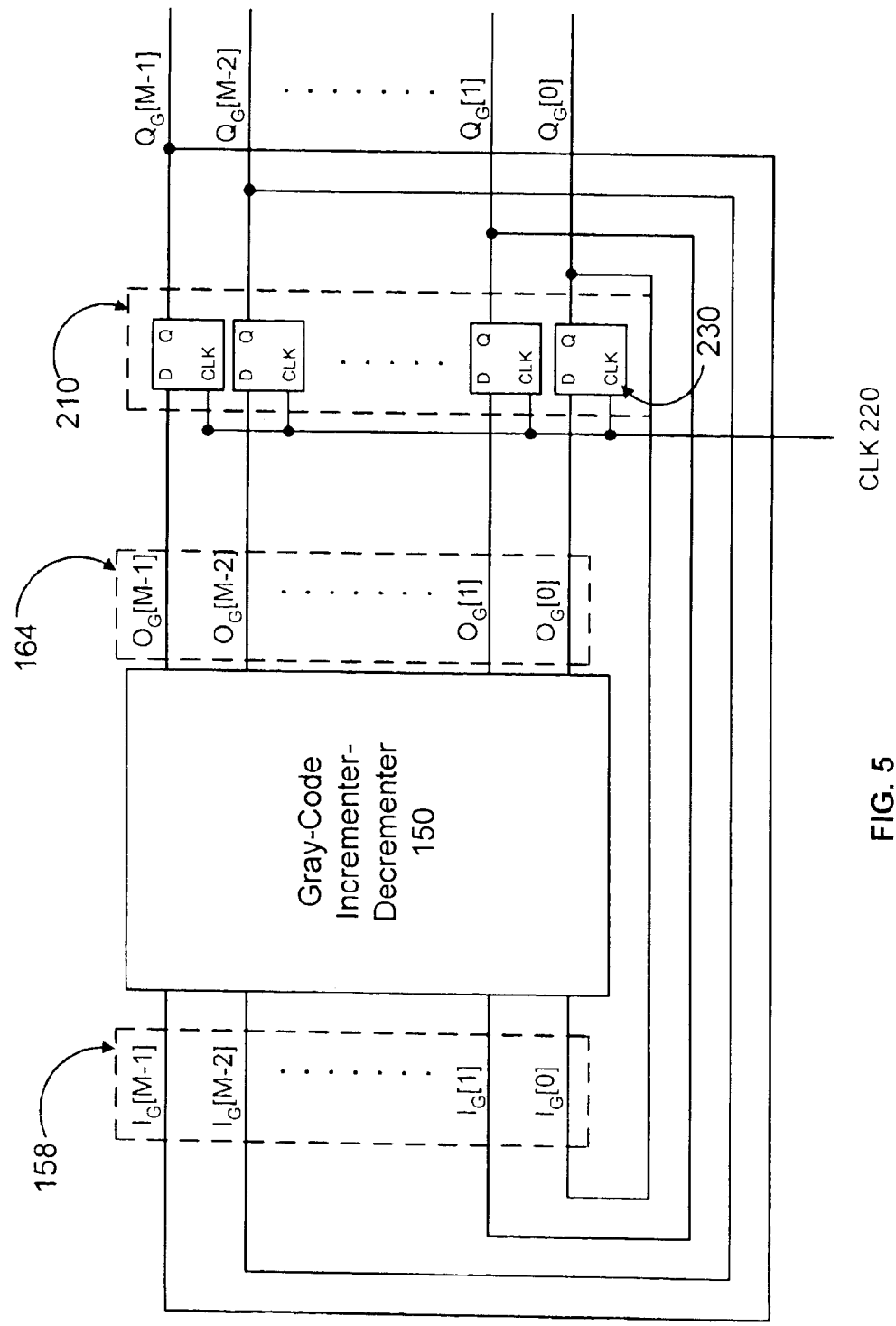
FIG. 5 is a schematic block diagram of a modulo N Gray-code counter in accordance with the present invention.

FIG. 5 is a schematic block diagram of a modulo N Gray-Code counter 200 incorporating Gray-code incrementer-decrementer 150 of FIG. 4. Gray-code counter 200 includes Gray-code incrementer-decrementer 150, the operation of which is disclosed with regards to FIG. 4, and an M-bit clocked storage device 210. M-bit clocked storage device 210 can be an M-bit register. M-bit clocked storage device 210 comprises M D-type flip-flops 230 clocked by clock 220. M-bit clocked storage device 210 stores an M-bit Gray-code count, expressed as bit values $Q_G[0]$-$Q_G[M-1]$. This count is the output of Gray-code counter 200 and is also the input to Gray-code incrementer-decrementer 150 (i.e., the input to Gray-to-Binary converter 152), expressed as M-bit Gray-code value 158 bit values $I_G[0]$-$I_G[M-1]$.

Upon receipt of a clock signal at its clock inputs, M-bit clocked storage device 210 replaces the stored M-bit Gray-code count $Q_G[0]$-$Q_G[M-1]$ with the next M-bit Gray-code count (M-bit Gray-code output value 164). The Gray-code incrementer-decrementer 150 of the present invention, together with M-bit clocked storage device 210, can provide a non-power-of-two modulo N Gray-code counter 200, for any even integer depth value, that will preserve the Gray-code nature of the counter. The output from Gray-code counter 200 can be, for example, the pointer value for a RAM-based FIFO.

The operation of Gray-code counter 200 of FIG. 5 is otherwise as described for Gray-code incrementer-decrementer 150. M-bit clocked storage device 210 provides the added functionality needed to turn Gray-code incrementer-decrementer 150 into a Gray-code counter 200 in accordance with the teachings of this invention. Gray-code counter 200 implements a method of operating a non-power-of-two modulo N Gray-code counter. This method is flow-charted in FIG. 6.

Figure 6:
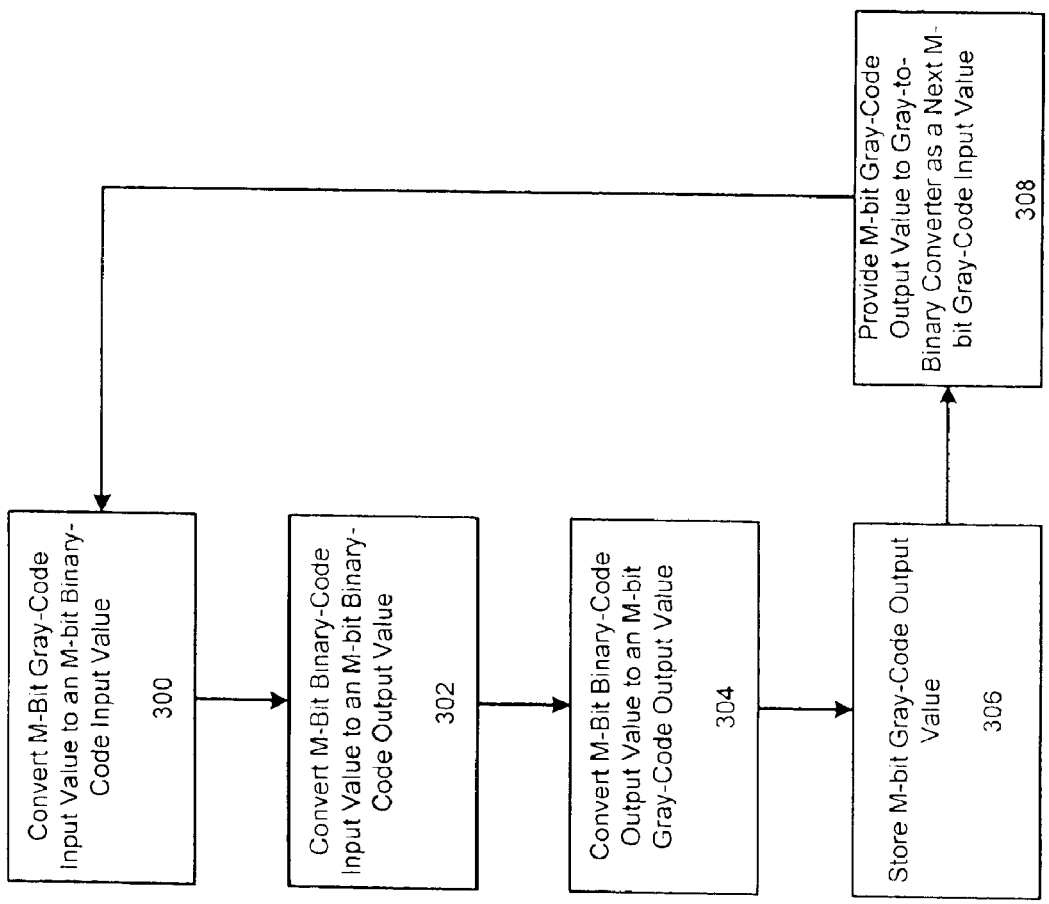
FIG. 6 is a flowchart of a method of operating a non-power-of-two modulo N Gray-code counter in accordance with the present invention.

At step 300 of FIG. 6, a prior M-bit Gray-code input value $I_G[M-1:0]$ is converted to an M-bit binary-code input value 160, represented by the bit values $I_B[M-1:0]$ (Note that for the purposes of this discussion, a range of bit values expressed as, for example, $I_B[M-1:0]$, represents the same range of bit values as $I_B[0]$-$I_B[M-1]$). At step 302, the M-bit binary-code input value 160 is converted to an M-bit binary-code output value 162, represented by bit values $O_B[M-1:0]$, wherein the M-bit binary-code output value 162 will differ from the M-bit binary-code input value 160 by modulo +/−1 (one unit) for all but one value of the M-bit binary-code input value 160. Step 302 occurs within BIN 154 and is implemented according to the embodiments of the BIN algorithm disclosed above.

At step 304, the M-bit binary-code output value is converted to an M-bit Gray-code output value 164 ($O_G[M-1:0]$). The M-bit Gray-code output value 164 is stored at step 306 based upon receipt of a clock signal and, at step 308, upon receipt of a next clock signal, the M-bit Gray-code output value 164 is provided as a next M-bit Gray-code input value 158 ($I_G[M-1:0]$) to supercede the prior M-bit Gray-code input value 158 of step 300. The method then repeats on subsequent clock signals to provide the counter functionality of a Gray-code counter 200 designed and operated in accordance with the teachings of this invention.

Figure 7:
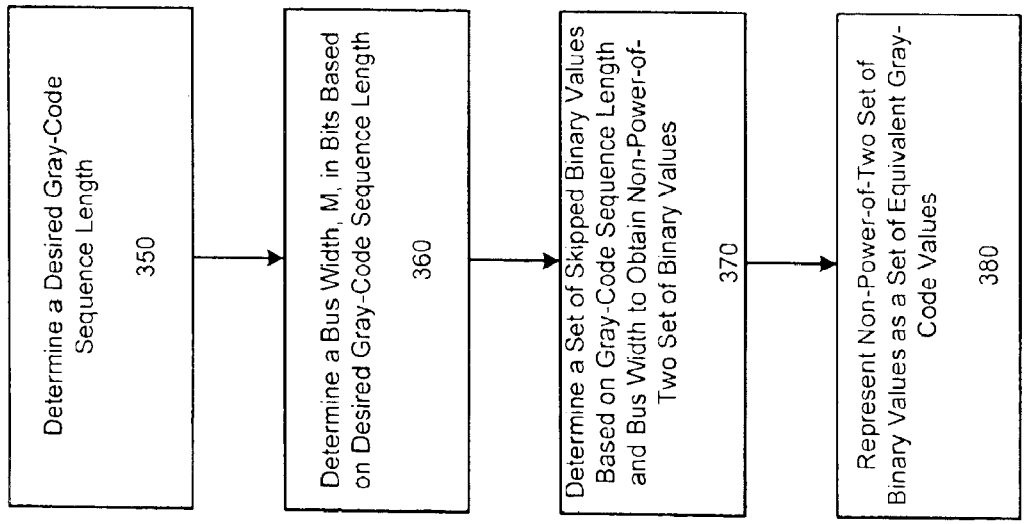
FIG. 7 a flowchart of a method for generating a modulo Gray-code representation of a non-power-of-two set of binary values in accordance with the present invention.

The present invention provides a convenient method for generating a modulo Gray-code representation of a non-power-of-two set of binary values. This method corresponds to the embodiments of the BIN algorithm disclosed above in that it can be used to determine the number and sequential location of the binary values to be skipped. The method is flow-charted in FIG. 7.

At step 350, a desired Gray-code sequence length is determined. The Gray-code sequence length is equal to the value N, and can correspond to the desired range of a modulo Gray-code counter 200, or to the depth of a FIFO buffer associated with a Gray-code counter 200. N is an even whole number and can be a non-power-of-two value. At step 360, a bus width, M, in bits is determined based on the desired Gray-code sequence length to represent the generated Gray-code. The value of M is obtained by determining a value of $2^M$ that is greater than or equal to N, where M is a positive whole value. The preferred value of M is typically obtained by using the smallest value of $2^M$ that is greater than or equal to N. At step 370, a set of skipped binary values is determined based on the Gray-code sequence length and the bus width to obtain the non-power-of-two set of binary values. At step 380, the non-power-of-two set of binary values is represented as a set of equivalent Gray-code values obtained in a traditional conversion from binary to Gray-code.

Step 370 can be accomplished in a number of ways. In one embodiment, corresponding to the first embodiment of the BIN algorithm of this invention disclosed above, step 370 comprises determining an initial set of $2^M$ sequential binary values; determining a number, S, of binary values to skip, where $S=2^M-N$; eliminating from the initial set of $2^M$ binary values the first S/2 binary values and the last S/2 binary values; and populating the non-power-of-two set of binary values with the remaining sequential binary values. These binary values can then be converted to an equivalent set of Gray-code values.

In another embodiment, corresponding to the second embodiment of the BIN algorithm of this invention disclosed above, step 370 comprises determining an initial set of $2^M$ sequential binary values; determining a number, S, of binary values to skip, where $S=2^M-N$; eliminating from the initial set of $2^M$ sequential binary values the middle S binary values; and populating the non-power-of-two set of binary values with the remaining sequential binary values. These binary values can then be converted to an equivalent set of Gray-code values.

Figure 8:
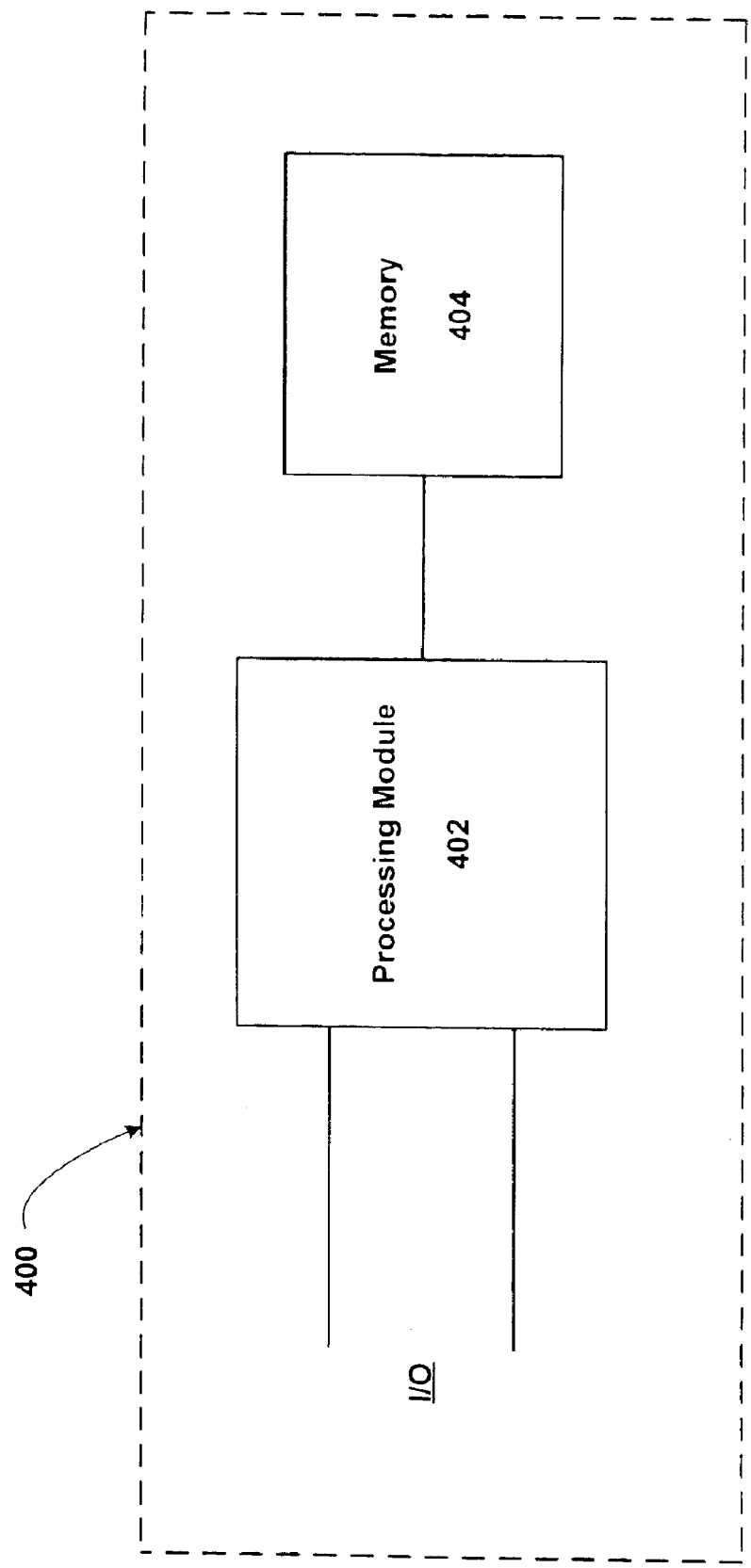
FIG. 8 is a schematic block diagram of an apparatus implementing an embodiment of the non-power-of-two modulo N Gray-code counter in accordance with the present invention.

A further embodiment of the present invention can comprise an apparatus for non-power-of-two modulo N Gray-code counting. As shown in FIG. 8, the apparatus 400 can comprise a processing module 402 and a memory 404. Processing module 402 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 404 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 402 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 404 stores, and the processing module 402 executes, operational instructions corresponding to at least some of the steps and/or functions illustrated in FIGS. 4–7.

In a particular embodiment of apparatus 400, the memory 404 is operably coupled to processing module 402 and includes operational instructions that cause the processing module 402 to convert an M-bit Gray-code input value to an M-bit binary-code input value, $I_B$[m-1:0]; convert the M-bit binary-code input value to an M-bit binary-code output value, $O_B$[m-1:0], wherein the M-bit binary-code output value will differ from the M-bit binary-code input value by modulo +/−1 for all but one value of the M-bit binary-code input value; convert the M-bit binary-code output value to an M-bit Gray-code output value; store the M-bit Gray-code output value based on a clock signal; and provide the M-bit Gray-code output value to the Gray-to-binary converter as a next M-bit Gray-code input value upon a next clock signal. The step of converting the M-bit binary-code input value to an M-bit binary-code output value, $O_B$[m-1:0] can be accomplished in accordance with the embodiments of the BIN algorithm of this invention as disclosed above.

The present invention provides for Gray-code counters and binary incrementer-decrementer algorithms that have modulos that are not powers of two. Optimal FIFO sizes, for example, can therefore be accommodated. Further, the present invention can provide for more effective use of integrated circuit area. The present invention also provides a simple algorithm for designing a non-power-of-two modulo N Gray-code counter. A computer program running, for example, synthesizable HDL (Hardware Description Language) can easily generate Gray-code counter designs in accordance with this invention for any given modulo.

As one of average skill in the art will appreciate, other embodiments may be derived from the teaching of the present invention, without deviating from the scope of the claims.

What is claimed is:

1. A method for generating a modulo Gray-code representation of a non-power-of-two set of binary values, comprising:

determining a desired Gray-code sequence length, N, that is an even whole number;

determining a bus width, M, in bits, based on the desired Gray-code sequence length, to represent the generated Gray-code, wherein $2^M$ is greater than or equal to N;

determining a set of skipped binary values based on a binary increment-decrement algorithm to obtain the non-power-of-two set of binary values; and representing the non-power-of-two set of binary values as a set of equivalent Gray-code values.

2. The method of claim 1, wherein determining the desired Gray-code sequence length comprises determining the desired depth of a FIFO (first-in-first-out) buffer, and setting N equal to the depth of the FIFO buffer.

3. The method of claim 1, wherein the binary increment-decrement algorithm comprises:

determining an initial set of $2^M$ sequential binary values;

determining a number, S, of binary values to skip, where $S=2^M-N$;

eliminating from the initial set of $2^M$ sequential binary values the first S/2 binary values and the last S/2 binary values; and populating the non-power-of-two set of binary values with the remaining sequential binary values.

4. The method of claim 1, wherein the binary increment-decrement algorithm comprises:

determining an initial set of $2^M$ sequential binary values;

determining a number, S, of binary values to skip, where $S=2^M-N$;

eliminating from the initial set of $2^M$ sequential binary values the middle S binary values; and populating the non-power-of-two set of binary values with the remaining sequential binary values.

5. The method of claim 1, further comprising:

determining an initial set of $2^M$ sequential binary values, wherein the non-power-of-two set of binary values is a subset of the initial set of $2^M$ sequential binary values; and generating a Gray-code representation of the initial set of $2^M$ sequential binary values.

6. The method of claim 5, wherein the initial set of $2^M$ sequential binary values comprises the values zero through $2^{M-1}$.

* * * * *